United States Patent
Park et al.

(10) Patent No.: US 8,253,916 B2
(45) Date of Patent: Aug. 28, 2012

(54) LIQUID CRYSTAL DISPLAY DEVICE

(75) Inventors: Seung Ryull Park, Anyang-si (KR); Joon Dong Lee, Anyang-si (KR)

(73) Assignee: LG Display Co., Ltd.

(*) Notice: Subject to any disclaimer, the term of this patent is extended or adjusted under 35 U.S.C. 154(b) by 200 days.

(21) Appl. No.: 11/400,422

(22) Filed: Apr. 7, 2006

(65) Prior Publication Data

US 2006/0226426 A1    Oct. 12, 2006

(30) Foreign Application Priority Data

Apr. 8, 2005 (KR) .................. 10-2005-0029408

(51) Int. Cl.
*G02F 1/1339* (2006.01)
*G02F 1/136* (2006.01)
*G02F 1/1333* (2006.01)

(52) U.S. Cl. ........... 349/155; 349/42; 349/110; 349/138
(58) Field of Classification Search .......... 349/155–157, 349/42, 46, 110, 122, 138, 139
See application file for complete search history.

(56) References Cited

U.S. PATENT DOCUMENTS

| | | | |
|---|---|---|---|
| 6,330,047 B1 * | 12/2001 | Kubo et al. | 349/147 |
| 6,690,445 B2 * | 2/2004 | Matsumoto | 349/155 |
| 6,806,934 B2 * | 10/2004 | Furuhashi et al. | 349/139 |
| 2003/0214621 A1 * | 11/2003 | Kim et al. | 349/155 |
| 2004/0114087 A1 * | 6/2004 | Cho et al. | 349/155 |
| 2004/0189928 A1 * | 9/2004 | Yang et al. | 349/155 |
| 2004/0257519 A1 * | 12/2004 | Jun et al. | 349/155 |
| 2005/0052607 A1 * | 3/2005 | Mori et al. | 349/155 |

FOREIGN PATENT DOCUMENTS

| | | |
|---|---|---|
| JP | 10-096955 | 4/1998 |
| JP | 2000-002889 | 1/2000 |
| JP | 2004-205549 | 7/2004 |

* cited by examiner

*Primary Examiner* — Brian M. Healy
*Assistant Examiner* — Charles Chang
(74) *Attorney, Agent, or Firm* — Brinks Hofer Gilson & Lione

(57) ABSTRACT

An LCD device according to the present invention includes having first and second substrates facing each other gate and data lines crossing each other to define a pixel region, a thin film transistor including a gate electrode protruding from the gate line, a source electrode protruding from the data line and a drain electrode spaced from the source electrode at a predetermined interval, a metal pattern over a predetermined portion of the gate line, a passivation layer over the data line and the metal pattern to have a contact hole exposing the drain electrode and a storage hole exposing the metal pattern, a pixel electrode on the pixel region over the contact hole and the storage hole, a column spacer contacting with the pixel electrode through the storage hole and a liquid crystal layer between the first and second substrates.

9 Claims, 13 Drawing Sheets

LIQUID CRYSTAL DISPLAY DEVICE

This application claims the benefit of priority to Korean Patent Application No. P2005-29408, filed on Apr. 8, 2005, herein incorporated by reference.

TECHNICAL FIELD

The present invention relates to a liquid crystal display (LCD) device, and more particularly, to an LCD device in which a column spacer is configured to contact a storage hole to minimize movement of substrates due to external forces such as touch.

BACKGROUND

With the development of an information-based society, the demand for display devices has increased. Accordingly, there has been significant research and development of various flat display devices, including liquid crystal display (LCD), plasma display panel (PDP), electroluminescent display (ELD), and vacuum fluorescent display (VFD) devices. Some of these flat display devices have already been applied to displays in various devices.

Among the various flat display devices, the liquid crystal display (LCD) device has been widely used due to its thin profile, light weight, and low power consumption. In view of these features, LCD display devices have increasingly replaced cathode ray tube (CRT) display devices. LCD technology has extended to mobile-type LCD devices, including displays for notebook computers, as well as computer monitors and televisions.

To utilize LCD devices as general display devices, recent technological developments have focused on implementing high quality images with high resolution and high luminance in a large screen, while maintaining thinness, light weight, and low power consumption.

FIG. 1 is an exploded perspective view illustrating a related art Twisted Nematic (TN) mode LCD device. The related art device includes first and second substrates 1 and 2 facing each other and spaced at a predetermined interval therebetween, and a liquid crystal layer 3 interposed between the two substrates.

The first substrate 1 includes gate lines 4, data lines 5, pixel electrodes 6, and thin film transistors T. Gate lines 4 are formed on the first substrate 1 in one direction at fixed intervals. Data lines 5 are formed perpendicular to the gate lines 4 at fixed intervals to define a plurality of pixel regions P. The pixel electrodes 6 are formed in the pixel regions P and are connected with the thin film transistors T formed at regions where the gate lines 4 and data lines 5 intersect.

The second substrate 2 includes a black matrix layer 7 for excluding light from non-pixel regions, R(red)/G(green)/B(blue) color filter layers 8 for displaying various colors, and a common electrode 9 for displaying a picture image on the color filter layers 8.

In the aforementioned LCD device, the liquid crystal layer 3 is formed between the first and second substrates 1 and 2, wherein liquid crystal molecules are driven by an electric field generated between a pixel electrode 6 and a common electrode 9. Images are displayed by controlling light transmittance through the liquid crystal layer 3 according to their alignment direction.

The above-described twisted nematic (TN) mode LCD device has a characteristic disadvantage of narrow viewing angles. In-plane switching (IPS) mode LCD devices have been recently developed to overcome this problem. In an IPS mode LCD device, a pixel electrode and a common electrode are formed in a pixel region of a first substrate in a coplanar arrangement to generate a horizontal electric field enabling alignment of the liquid crystal molecules.

A spacer may be formed between the first and second substrates 1 and 2 of the aforementioned LCD devices to maintain a constant interval for the liquid crystal layer. The spacer may be a ball spacer or a column spacer.

The ball spacer has a spherical shape, is dispersed on the first and second substrates 1 and 2, and can freely move therebetween. The ball spacer has a small contact area with the first and second substrates 1 and 2.

The column spacer has a columnar shape and is formed with a predetermined height by an array process on the first substrate or the second substrate. In contrast to a ball spacer, the column spacer has a relatively large contact area with the first and second substrates 1 and 2.

FIG. 2 is a plane view illustrating a related art LCD device provided with a column spacer. FIG. 3 is a structural sectional view taken along line I~I' of FIG. 2. The related art device depicted in FIG. 2 includes gate lines 4 and data lines 5 formed on the first substrate 1. The gate lines 4 and data lines 5 cross one another to define a plurality of pixel regions. Each pixel region contains a pixel electrode 6.

Thin film transistors (TFT) are formed at regions where the gate lines cross the data lines. Each TFT includes a gate electrode 4a protruding from the gate line 4, a source electrode 5a protruding from the data line 5, and a drain electrode 5b spaced apart from the source electrode 5a at a predetermined interval. Each TFT further includes a semiconductor layer (not shown) formed below the source and drain electrodes 5a and 5b to cover the gate electrode 4a.

A gate insulating layer 11 is formed over the entire surface of the first substrate 1 and a passivation layer 12 is formed on the gate insulating layer 11. A predetermined portion of the drain electrode 5b in contact with the passivation layer 12 defines a passivation hole. The pixel electrode 6 is connected to the drain electrode 5b through the passivation hole. The gate insulating layer 11 and the passivation layer 12 are formed of inorganic insulating material and are deposited at a thickness of 2000 Å to 4000 Å.

A black matrix layer 7 is formed on the second substrate 2 facing the first substrate 1. The black matrix layer 7 covers non-pixel regions (gate line 4, data line 5, and TFTs). A color filter layer 8 is formed on the second substrate 2, including the black matrix layer 7. The color filter layer 8 is formed by depositing R, G, and B pigments in each pixel region. A common electrode 9 may be formed over the entire surface of the second substrate 2, including the color filter layer 8. A column spacer 20 may be formed between the first and second substrates to maintain a constant cell gap therebetween. The column spacer 20 may be formed to correspond to an upper side of the gate line 4.

FIG. 4 is a plane view illustrating the surface of an IPS mode LCD panel provided with a column spacer in which a touch spot is generated. If the LCD panel 10 in the LCD device of FIG. 4 is touched with a finger or object along a predetermined direction, a spot may be generated along the touched portion. Because the spot is generated on the screen of the LCD panel, it is referred to as a touch spot or touch defect.

This touch defect is caused by frictional forces generated by the large contact areas between the column spacer and its opposing lower substrate. Unlike the case with the ball spacer, the larger contact area between a column spacer and the lower substrate necessitates a longer time for the first and second substrates to be restored to their original state after being shifted on account of the touch. The spot remains until original state is restored.

FIGS. 5A and 5B are sectional views of a related art LCD device illustrating a display area and a non-display area before and after the LCD panel is touched. In the non-display area, a seal pattern 45 bonds the two substrates 1 and 2 to one another. A black matrix layer 7 is formed on the second substrate 2 of the non-display area to prevent light from leaking. The display area is provided as described in FIGS. 2 and 3.

In this related art LCD device, the pixel electrode 6 and the common electrode 9 are formed on the first and the second substrates 1 and 2, respectively, so that a vertical electric field is generated between the first substrate 1 and the second substrate 2 to drive the liquid crystal molecules. In this case, the gate insulating layer 11 is formed between the gate line 4 and the data line 5, and a passivation layer 12 is interposed between the data line 5 and the pixel electrode 6.

In this related art LCD device, a black matrix layer 7 is formed on the second substrate 2 over the non-pixel regions of the first substrate 1, including the gate lines 4, data lines 5 and thin film transistors (see FIG. 2). As shown in FIG. 5A, the black matrix layer 7 overlaps the data line 5 and a space between the data line 5 and the pixel electrode 6 to prevent leakage of light. The color filter layer 8 is formed to overlap the pixel regions and to partially overlap the black matrix layer 7. The common electrode 9 is formed over the entire surface of the second substrate, including the black matrix layer 7 and the color filter layer 8.

As shown in FIG. 5B, when an LCD panel is touched, the second substrate 2 may shift and the seal pattern 45 may deviate in the direction of the shifted second substrate 2. Consequently, a peripheral portion of the data line 5 that was formerly covered by the black matrix layer 7 before touching becomes exposed after touching, thereby resulting in leakage of light.

FIGS. 6A and 6B illustrate another aspect of the related art LCD device before and after the LCD panel is touched. The left side of FIG. 6A illustrates an LCD device 10, including first and second substrates 30 and 40 facing one another and a liquid crystal layer 50 formed therebetween. The right side of FIG. 6A shows the surface of the LCD device 10 being touched with a finger. Here the substrate shifting is further accompanied by local wrinkling on the surface of the touched substrate 40, a non-uniform cell gap, and a dispersed alignment of liquid crystal molecules (FIG. 6B).

Thus, when the related art LCD device is touched, problems may arise, including light leakage resulting from the substrates being shifted, an uneven cell gap resulting from local wrinkling of the substrate, and an uneven luminance resulting from the dispersed alignment of the liquid crystal molecules.

SUMMARY

Accordingly, an LCD device is provided which can obviate one or more problems of the related art. In particular, an LCD device according to the present invention includes first and second substrates facing each other, whereby crossing gate and data lines are formed on the first substrate to define a pixel region. A thin film transistor is provided that includes a gate electrode protruding from the gate line, a source electrode protruding from the data line and a drain electrode spaced from the source electrode at a predetermined interval. A metal pattern is disposed over a predetermined portion of the gate line. A passivation layer is disposed over the data line and the metal pattern, the passivation layer having a contact hole exposing the drain electrode and a storage hole exposing the metal pattern. A pixel electrode is disposed on the pixel region over the contact hole and the storage hole. A column spacer is configured to contact the pixel electrode through the storage hole. A liquid crystal layer is interposed between the first and second substrates. The LCD device may further include a color filter layer and black matrix layer formed on either of the substrates.

The present invention further includes a method for fabricating an LCD device. The method includes forming a first substrate containing gate lines and date lines to define a pixel region. A thin film transistor is formed having a gate electrode connected to the gate line, a source electrode connected to the data line, and drain electrode spaced apart from the source electrode at a predetermined interval and connected thereto. A metal pattern is deposited over a predetermined portion of the gate line and at least one passivation layer is deposited over the data line. Portions of the passivation layer(s) are removed to form a contact hole exposing the drain electrode and a storage hole exposing the metal pattern. A pixel electrode is formed in the pixel region over the contact hole and the storage hole. A second substrate is formed to face the first substrate. A column spacer is formed, the column spacer configured to contact the pixel electrode through the storage hole. A liquid crystal layer is disposed between the first and second substrates and the substrates are bonded so that the spacer contacts the pixel electrode through the storage hole.

It is to be understood that both the foregoing general description and the following detailed description of the present invention are exemplary and explanatory and are intended to provide further explanation of the invention as claimed.

DETAILED DESCRIPTION

Figure 1:
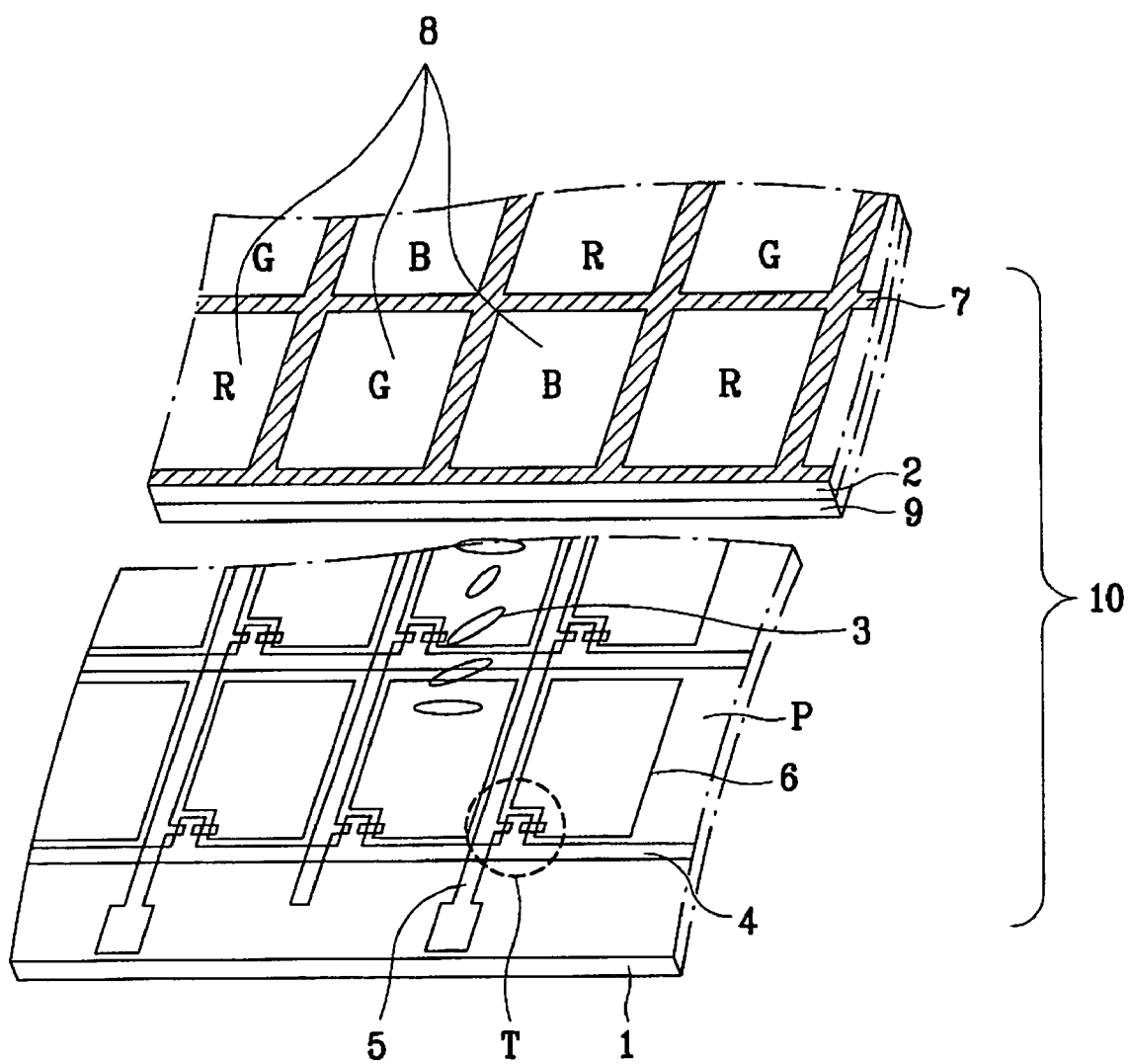
FIG. 1 is an exploded perspective view illustrating a related art LCD device.
Figure 2:
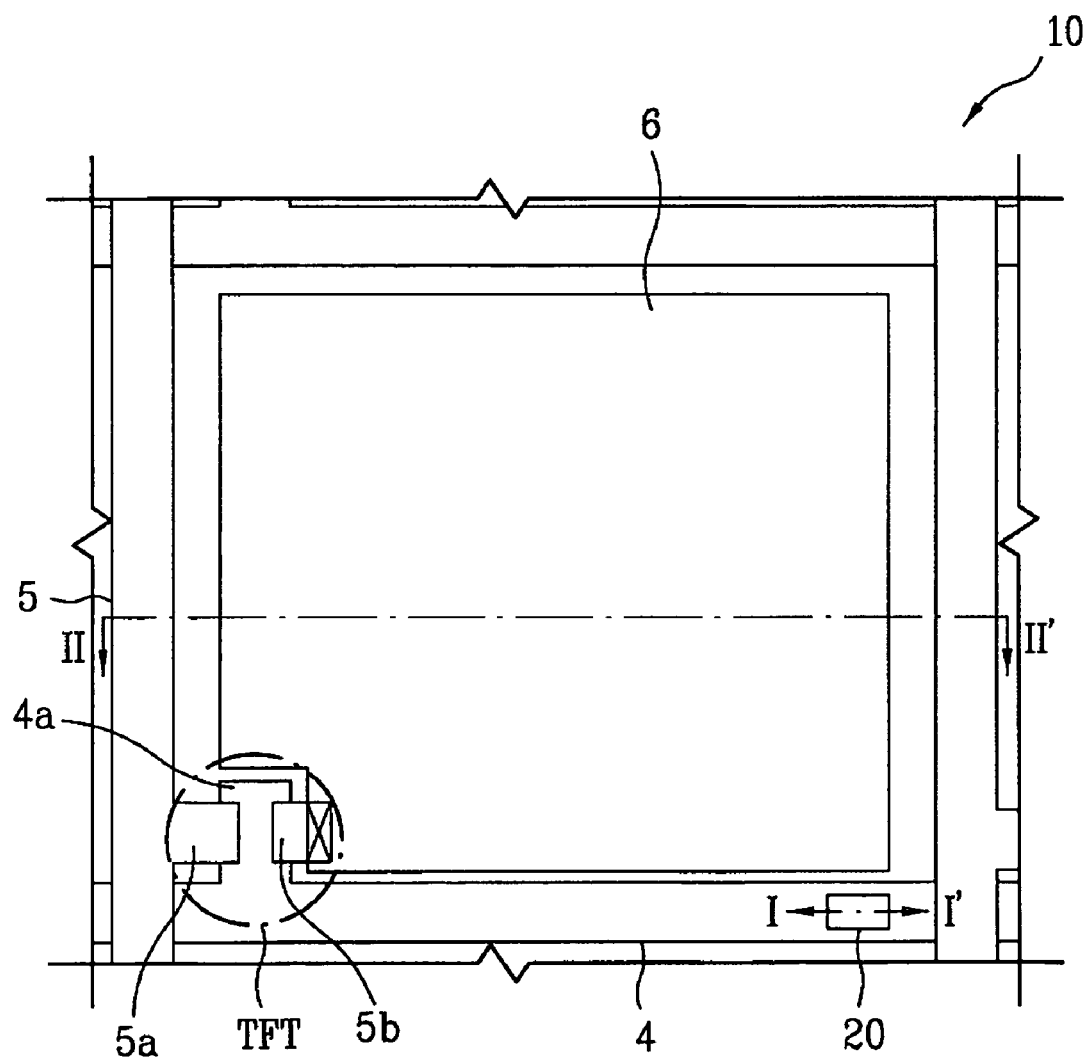
FIG. 2 is a plane view illustrating a pixel region in a related art LCD device.
Figure 3:
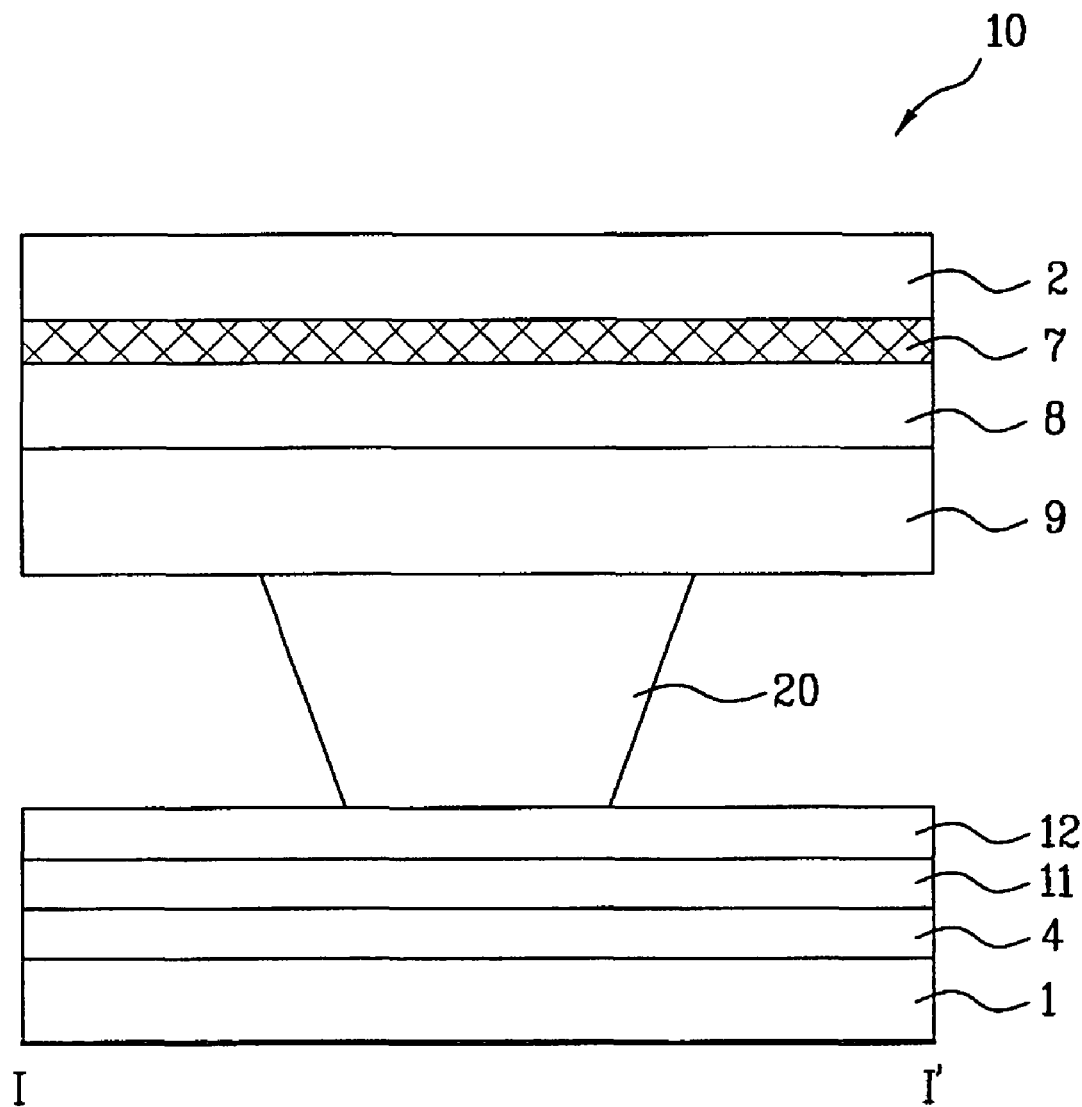
FIG. 3 is a structural sectional taken along line I~I' of FIG. 2.
Figure 4:
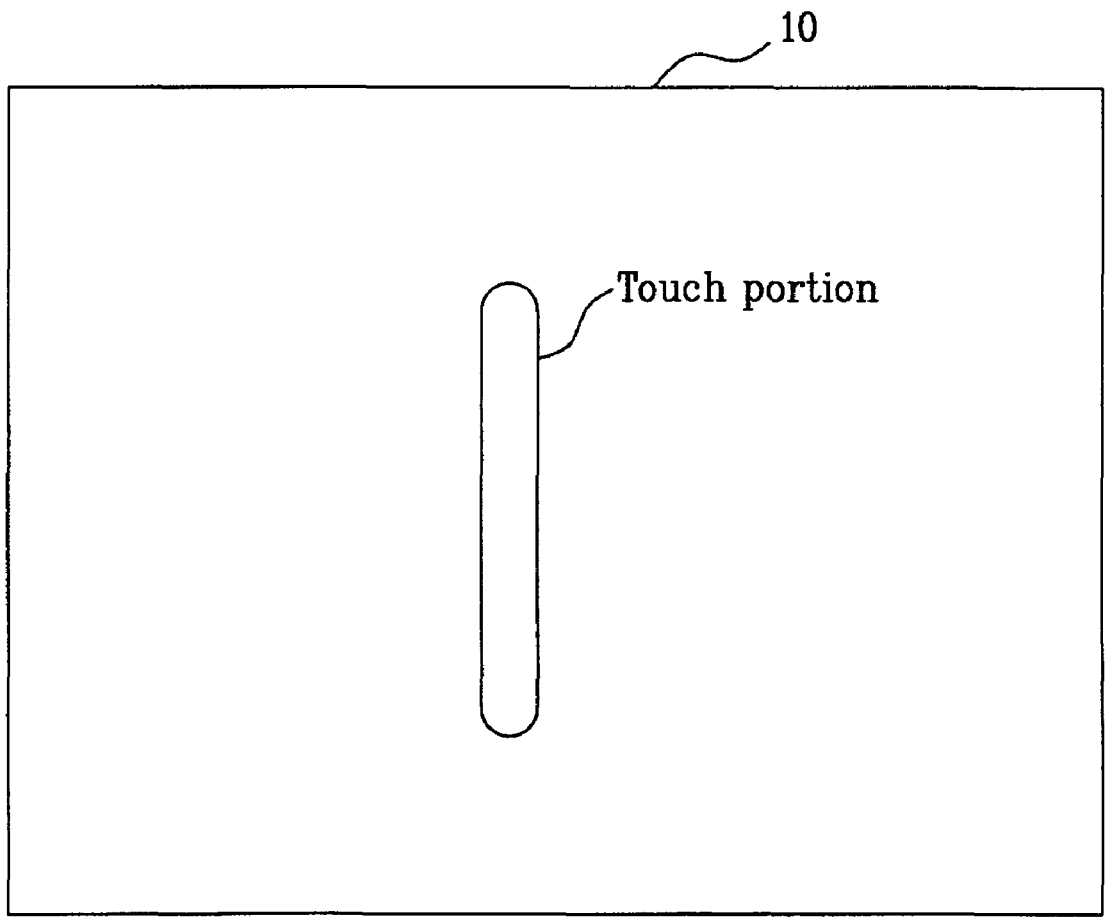
FIG. 4 is a plane view illustrating a surface of an LCD panel when a touch spot is generated.
Figure 5A:
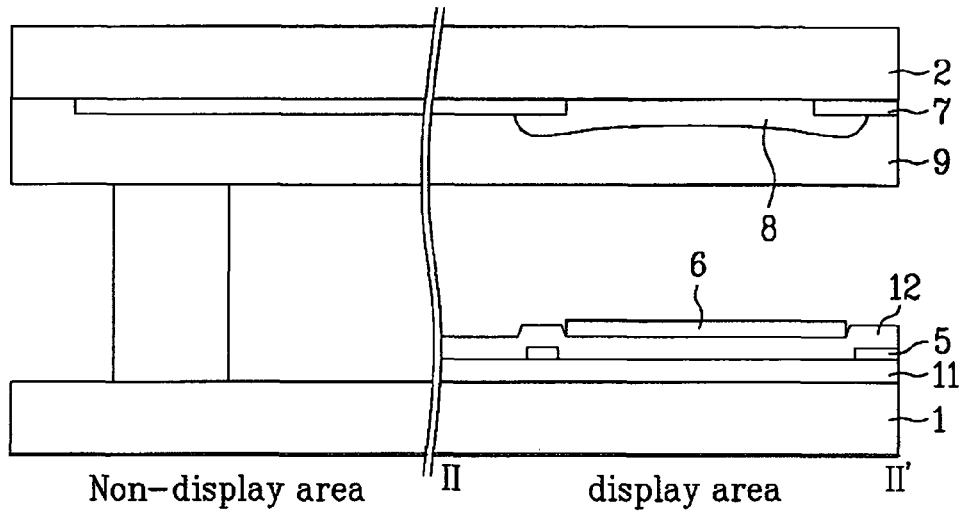
FIGS. 5A and 5B are sectional views illustrating an aspect of a related art LCD device before and after a touch spot is generated.
Figure 5B:
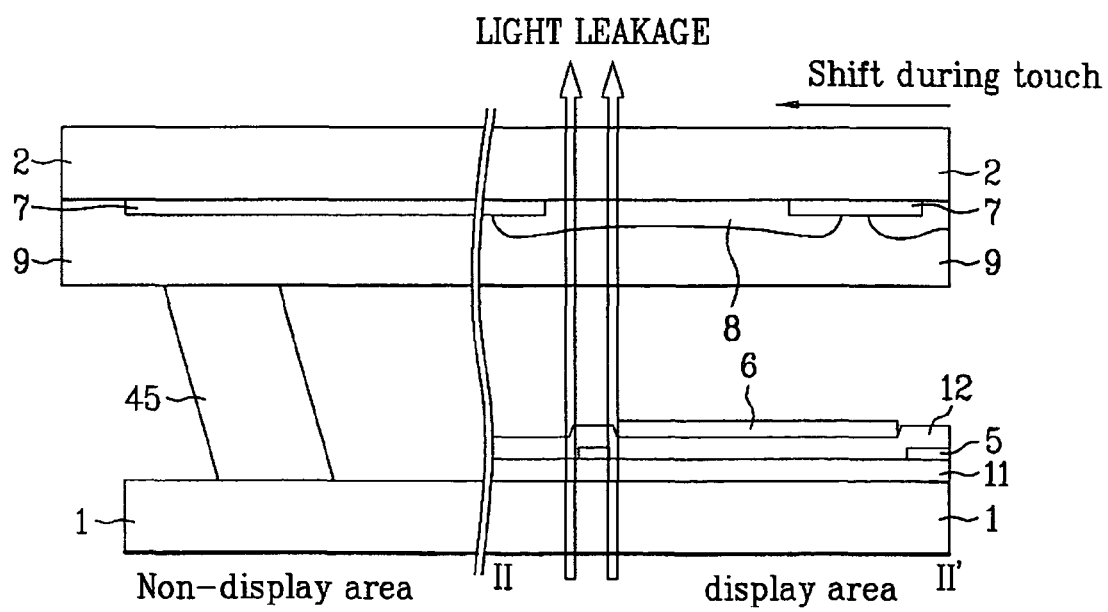
Figure 6A:
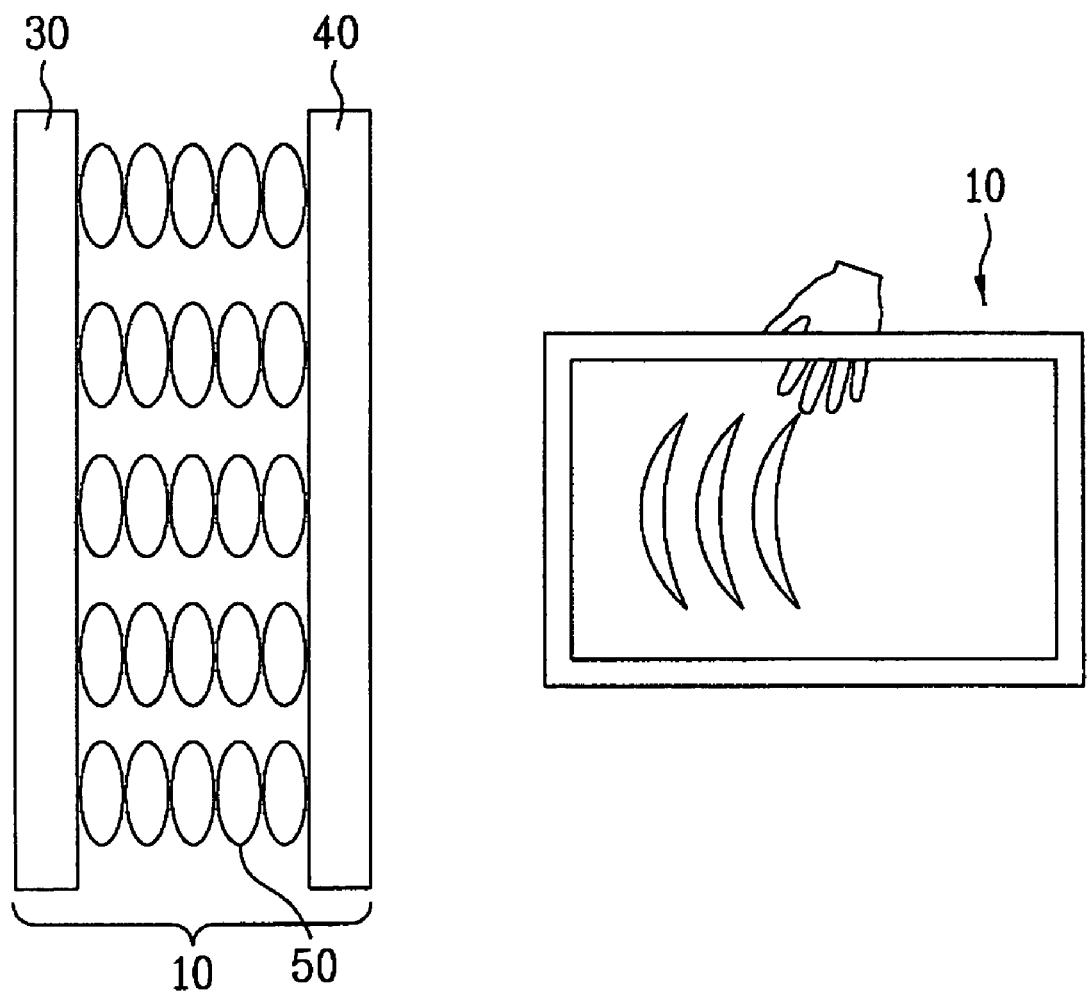
FIGS. 6A and 6B are sectional views illustrating another aspect of a related art LCD device that is touched.
Figure 6B:
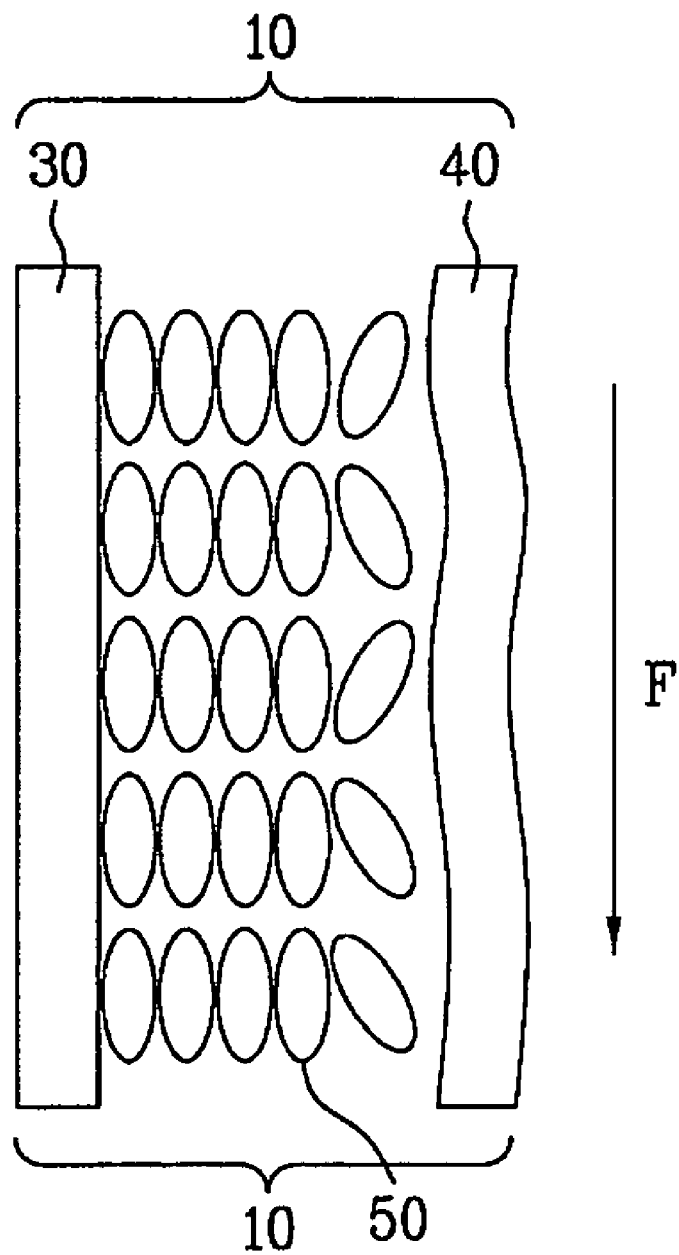
Figure 7:
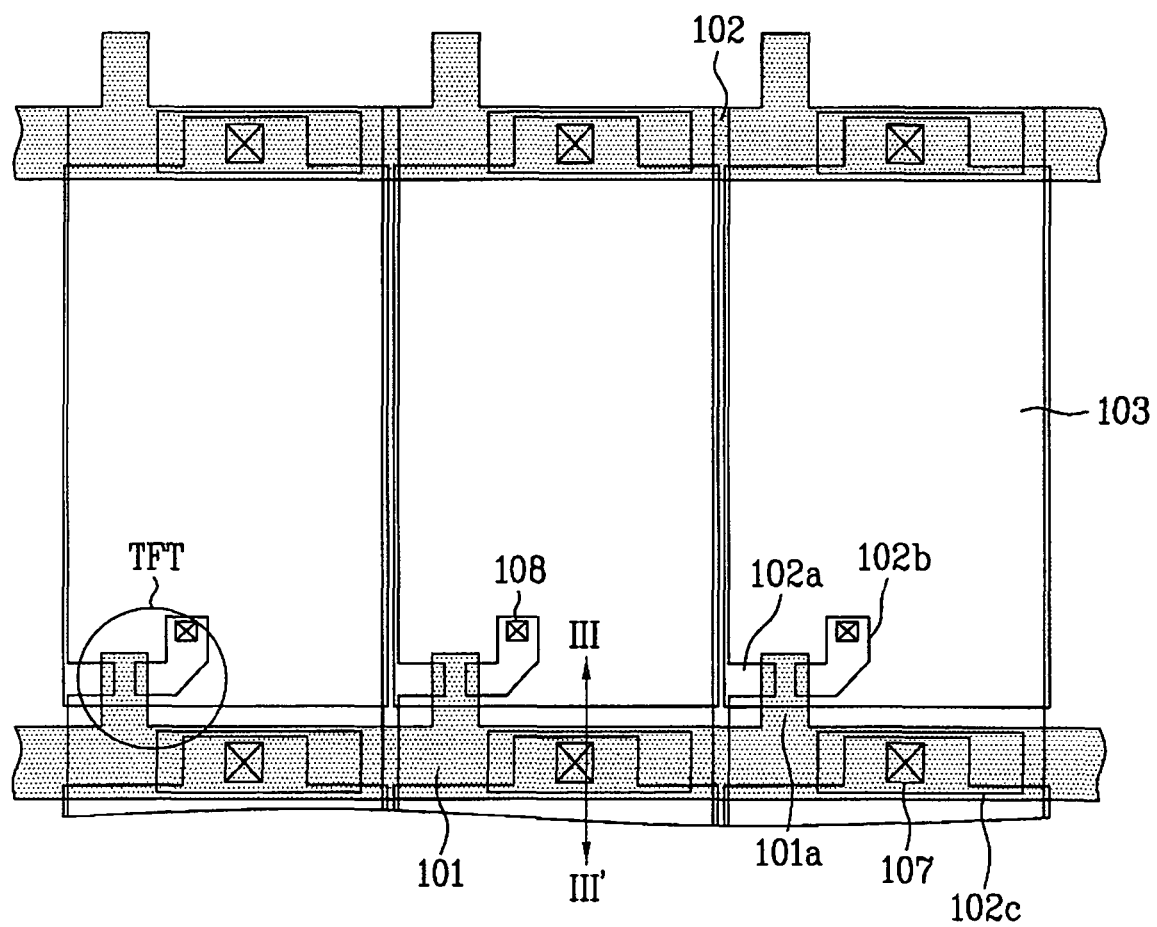
FIG. 7 is a plane view illustrating an LCD device according to an aspect of the present disclosure.
Figure 8:
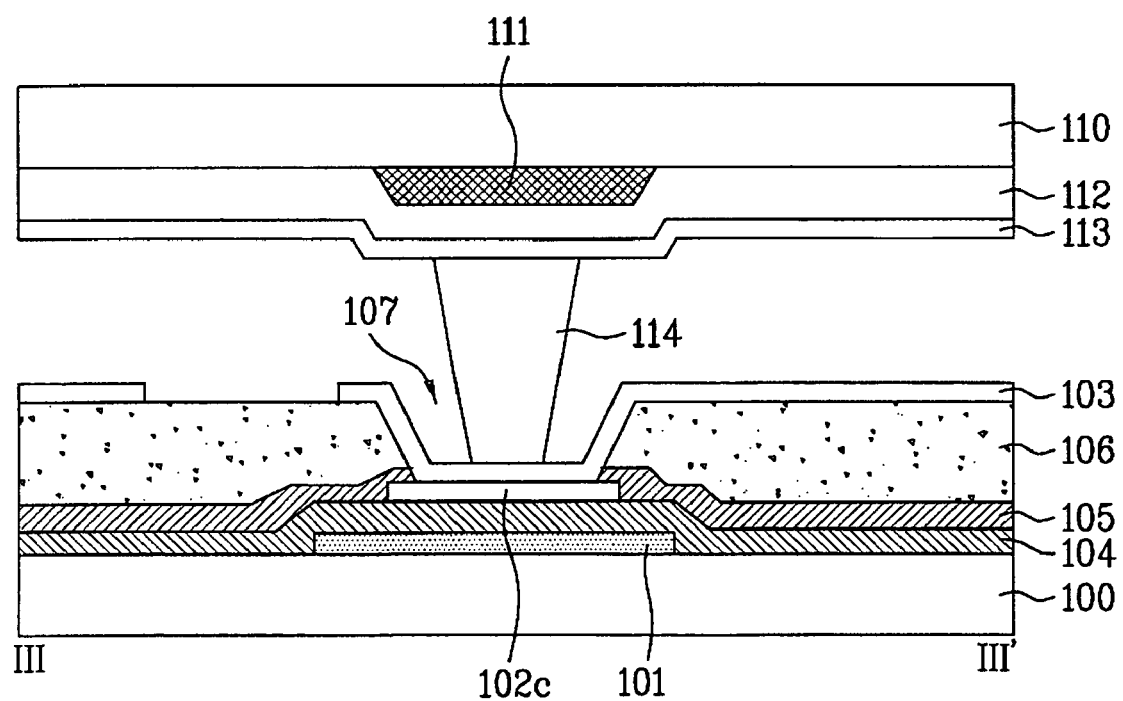
FIG. 8 is a sectional view taken along line III~III' of FIG. 7.

Reference will now be made in detail to the preferred embodiments of the present invention, examples of which are illustrated in the accompanying drawings. FIG. 7 is a plane view illustrating an LCD device according to one embodiment of the present invention FIG. 8 is a sectional view taken along line III~III' of FIG. 7. The LCD device includes a first substrate 100 having a thin film transistor array, a second substrate 110 having a color filter array, and a liquid crystal layer (not shown) between the first and second substrates 100 and 110. The first and second substrates 100 and 110 face each other.

The first substrate 100 includes gate and data lines 101 and 102 crossing each other to define a pixel region, a gate insulating layer 104 formed between the gate and data lines 102, and a thin film transistor TFT (FIG. 7). The TFT includes a gate electrode 101a protruding from the gate line 101, a source electrode 102a protruding from the data line 102 and a drain electrode 102b spaced apart from the source electrode 102a at a predetermined interval. A metal pattern 102c may be formed on a predetermined portion of the gate line 101. The metal pattern 102c may be in the same layer as the data line 102 and it may be formed flush with the data line 102. An organic passivation layer 106 is formed on the first substrate 100 over the data line 102 and the metal pattern 102c. The passivation layer 106 includes a contact hole 108 exposing the drain electrode 102b and a storage hole 107 exposing the metal pattern 102c. A pixel electrode 103 partially overlaps the data lines 102 on both sides of the pixel region, as well as the contact hole 108, the storage hole 107 and the pixel region.

In FIG. 8, an inorganic passivation layer 105 is optionally interposed between the data line 102, metal pattern 102c and organic passivation layer 106. The inorganic passivation layer 105 is formed on the first substrate 100 including the data line 102 and the metal pattern 102c, along with the organic passivation layer 106 to protect a layer below the pixel electrode 103.

The second substrate 110 includes a black matrix layer 111 overlapping TFTs and other non-pixel regions, a color filter layer 112 formed over the second substrate 110, including the black matrix layer 111, and a common electrode 113 formed over the entire surface of the second substrate 110, including the black matrix layer 111 and the color filter layer 112. A column spacer 114 is formed on the common electrode 113 and is configured to enter the storage hole 107 and to contact the pixel electrode 103 when the first and second substrates 100 and 110 are bonded to one another.

In view of the overlap between pixel electrode 103, the storage hole 107, and the data line 102, the LCD device has a high aperture ratio. Moreover, inclusion of the organic passivation layer 106 between the data line 102 and the pixel electrode 103 minimizes parasitic capacitance Cdp in the overlap region between the data line 102 and the pixel electrode 103.

The storage hole 107 has a critical dimension (CD) corresponding to a value obtained by adding a critical dimension of the column spacer 107 to a bonding margin between the first and second substrates 100 and 110. Following the array processes used to form the first and second substrates 100 and 110, the second substrate 110 may be shifted against the first substrate 100 when the second substrate 110 is bonded to the first substrate. Therefore, the bonding margin must be considered when designed the critical dimension of the storage hole 107. The bonding margin may depend on the size and model of the panel. Generally, the bonding margin is about 4 μm to 5 μm in the up, down, left and right directions.

Figure 9:
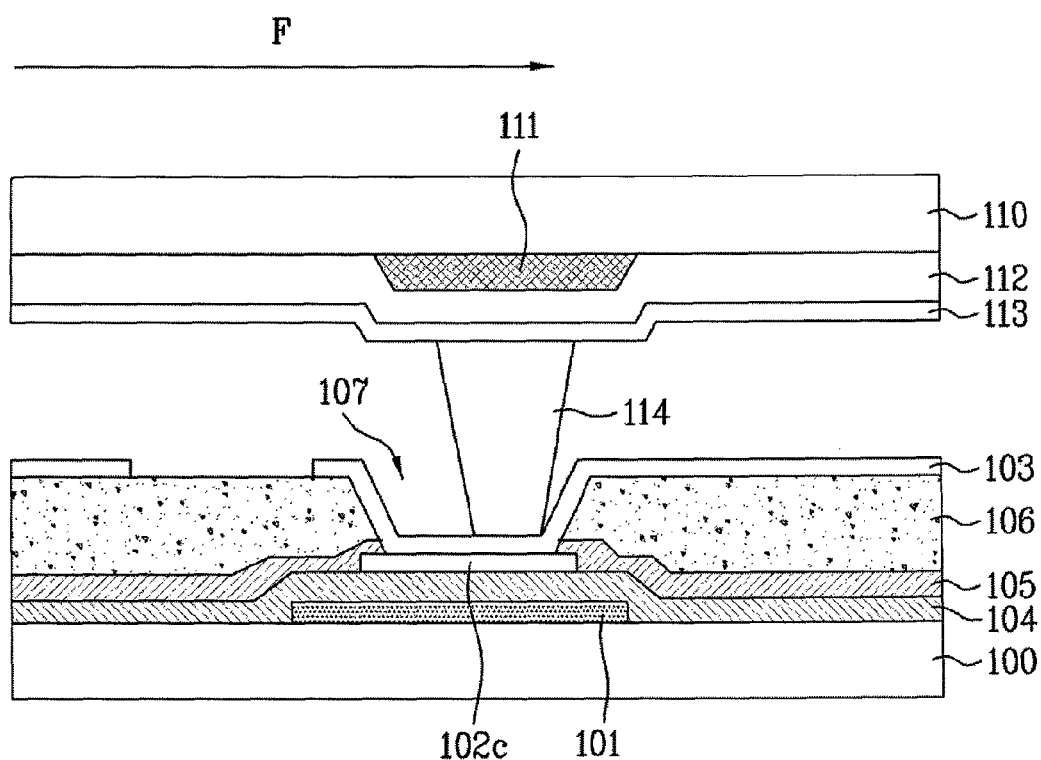
FIG. 9 is a sectional view illustrating variation occurring when an LCD device of the present invention is touched.

FIG. 9 is a sectional view illustrating a variation of an LCD device when touched. In FIG. 9, the column spacer 114 is positioned inside the storage hole 107. In this case, movement of the column spacer 114 is restricted to the area within the storage hole 107 when a touch force shifts the first 100 or second substrate 110 in a predetermined direction relative to the other. In other words, the column spacer 114 restricts movement of the second substrate 110 to the bonding margin range with the first substrate 100 (i.e., critical dimension of the storage hole 107 minus critical dimension corresponding to the portion of the column spacer 114 contacting the first substrate). Thus, it is possible to reduce shifting of the substrates to the range of the bonding margin or less, thereby reducing instantaneous light leakage when the LCD device is touched.

The storage hole 107 corresponds to a region from which portions of the organic passivation layer 106 and the inorganic passivation layer 105 are removed. Considering that the organic passivation layer 106 has a thickness of about 1 μm to 3 μm and the inorganic passivation layer 105 has a thickness of about 2000 Å to 4000 Å, the storage hole 107 may have a depth of about 1.2 μm to 3.4 μm. Thus, if the cell gap between the first and second substrates 100 and 110 is between about 3 μm to 5 μm, the depth of the storage hole 107 would be about ½~1 time that of the cell gap. It is presumed that the column spacer 114 does not readily stray from the storage hole 107 by means of a touch force (push force toward a side).

Figure 10:
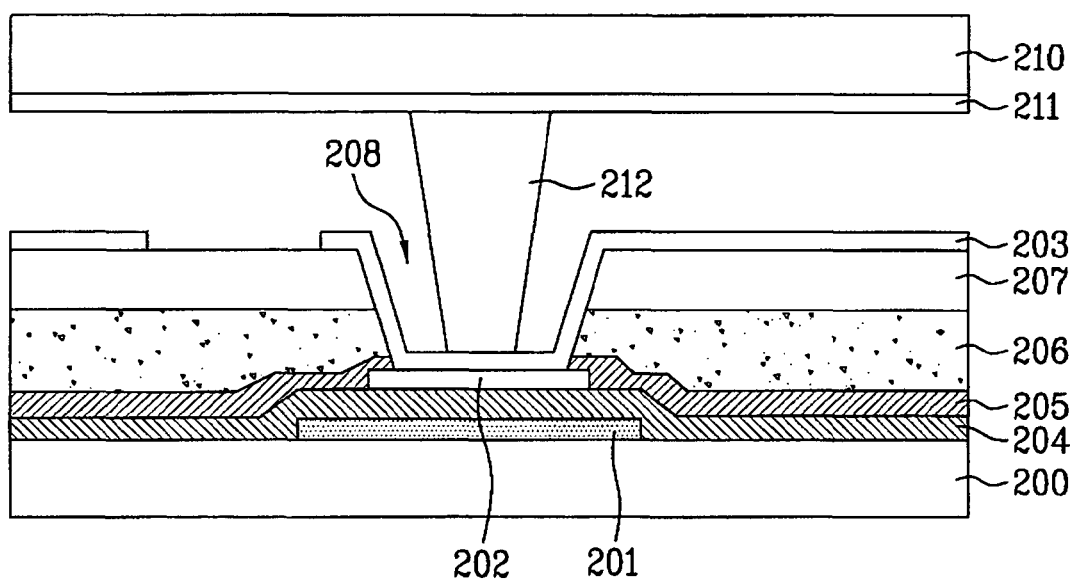
FIG. 10 is a sectional view illustrating an LCD device according to another aspect of the present disclosure.

FIG. 10 is a sectional view illustrating an LCD device according to another embodiment taken along the same line as III~III' of FIG. 7 in which a color filter array is applied to a color filter on TFT array (COT) formed on the first substrate. Herein, the LCD device includes a first substrate 200 having a thin film transistor array and a color filter array, a second substrate 210 facing the first substrate 200, and a liquid crystal layer filled between the first substrate 200 and the second substrate 210.

The first substrate 200 includes gate lines 201 and data lines (see e.g., 102 of FIG. 7) crossing each other to define a pixel region, a metal pattern 202 formed on a predetermined portion of the gate line 201, a gate insulating layer 204 formed between the gate 201 and data lines and the metal pattern 202, and a thin film transistor TFT (see FIG. 7). The TFT includes a gate electrode (see 101a in FIG. 7) protruding from the gate line 201, a source electrode (see 102a in FIG. 7) protruding from the data line (see 102 in FIG. 7) and a drain electrode (see 102b in FIG. 7) spaced apart from the source electrode at a predetermined interval. A color filter layer 206 may be formed on the first substrate 200 over the data line and the metal pattern 202. An organic passivation layer 207 is formed over the color filter layer 206. The organic passivation layer 207 and color filter layer 206 may include a contact hole (not shown) exposing the drain electrode and a storage hole 208 exposing the metal pattern 202. A pixel electrode 203 is formed on the pixel region, overlapping the contact hole and the storage hole 208.

Referring to FIG. 10, an inorganic passivation layer 205 may be optionally interposed between the metal pattern 202 and the color filter layer 206. The inorganic passivation layer 205 may be formed on the first substrate 200 over the data line and the metal pattern 202, along with the organic passivation layer 207 to protect a layer below the pixel electrode 203.

Although not shown in FIG. 10, a black matrix layer may be formed on the data line/metal pattern 202 on the first substrate 200 over non-pixel regions, including the gate line 201 and upper portions of the data line and TFT. In this case, the black matrix layer is preferably formed at least on the thin film transistor region, although it may be omitted from the gate line 201 and data line/metal pattern 202.

In FIG. 10, a common electrode 211 is formed on the entire surface of the second substrate 210 to generate a vertical electric field between the pixel electrode 203 and the common electrode 211. A column spacer 212 is formed on the common electrode 211 and is configured to enter the storage hole 208 on the first substrate 200 and to contact the pixel electrode 203 when the first and second substrates 200 and 210 are bonded to one another.

The LCD device depicted in FIG. 10 is the same as the LCD device shown in FIGS. 7 and 8, except that the color filter array of the color filter layer and the black matrix layer are formed on the first substrate 200. As in FIG. 7, the LCD device in FIG. 10 has a high aperture ratio, in view of the overlap between pixel electrode 203, the storage hole 208, and the data line. Furthermore, inclusion of the organic passivation layer 207 between the data line and the pixel electrode 203 minimizes parasitic capacitance Cdp in the overlap region between the data line and the pixel electrode 203.

The storage hole 208 and the contact hole in the LCD device according to FIG. 10 are formed by removing portions of the passivation layer 207, the color filter layer 206 and the inorganic passivation layer 205. As described above, the storage hole 208 has a critical dimension (CD) corresponding to a value obtained by adding a critical dimension of the column spacer 212 to a bonding margin in up, down, left and right directions.

When the first and second substrates 200 and 210 are bonded to each other, the column spacer 212 contacts the pixel electrode 203 in the storage hole 208. In this case, the storage hole 208 corresponds to a portion where the organic passivation layer 207, the color filter layer 206, and the inorganic passivation layer 205 are removed. Considering that the organic passivation layer 207 may have have a thickness of about 1 μm to 3 μm, the color filer layer, a thickness of about 1 μm to 2 μm, and the inorganic passivation layer 205, a thickness of about 2000 Å to 4000 Å, the storage hole 208 may have a depth of about 2.2 μm to 5.4 μm. Thus, if the cell gap between the first and second substrates 200 and 210 is between about 3 μm to 5 μm, the depth of the storage hole 208 is approximately within the range the cell gap. It is presumed that the column spacer 212 does not readily stray from the storage hole 208 by means of a touch force (push force toward a side).

As indicated in the Figures, the organic passivation layers 106 and 207 may be formed on the color filter layers 112 and 206 or vice versa. In either case, the color filter layers 112 and 206 may be formed of a high molecular weight material that can serve as an organic insulating layer. By providing different layers functioning as organic insulating layers, a structure having a low dielectric constant is formed between the data line/metal pattern 202 and the pixel electrode 203. Thus, the color filter layer 206 serves to minimize parasitic capacitance in the overlap portion between the data lines and the pixel electrode 203.

In the aforementioned COT type LCD device of FIG. 10, since the black matrix layer is formed on the first substrate, light leakage does not occur due to touch. However, instantaneous light leakage may occur due to an uneven cell gap caused by an instantaneous push of the substrate. In this embodiment, the column spacer 212 moves only inside the storage hole 208 to reduce shifting between the substrates. Accordingly, this can prevent uneven luminance from occurring due an uneven cell gap.

Figure 11A:
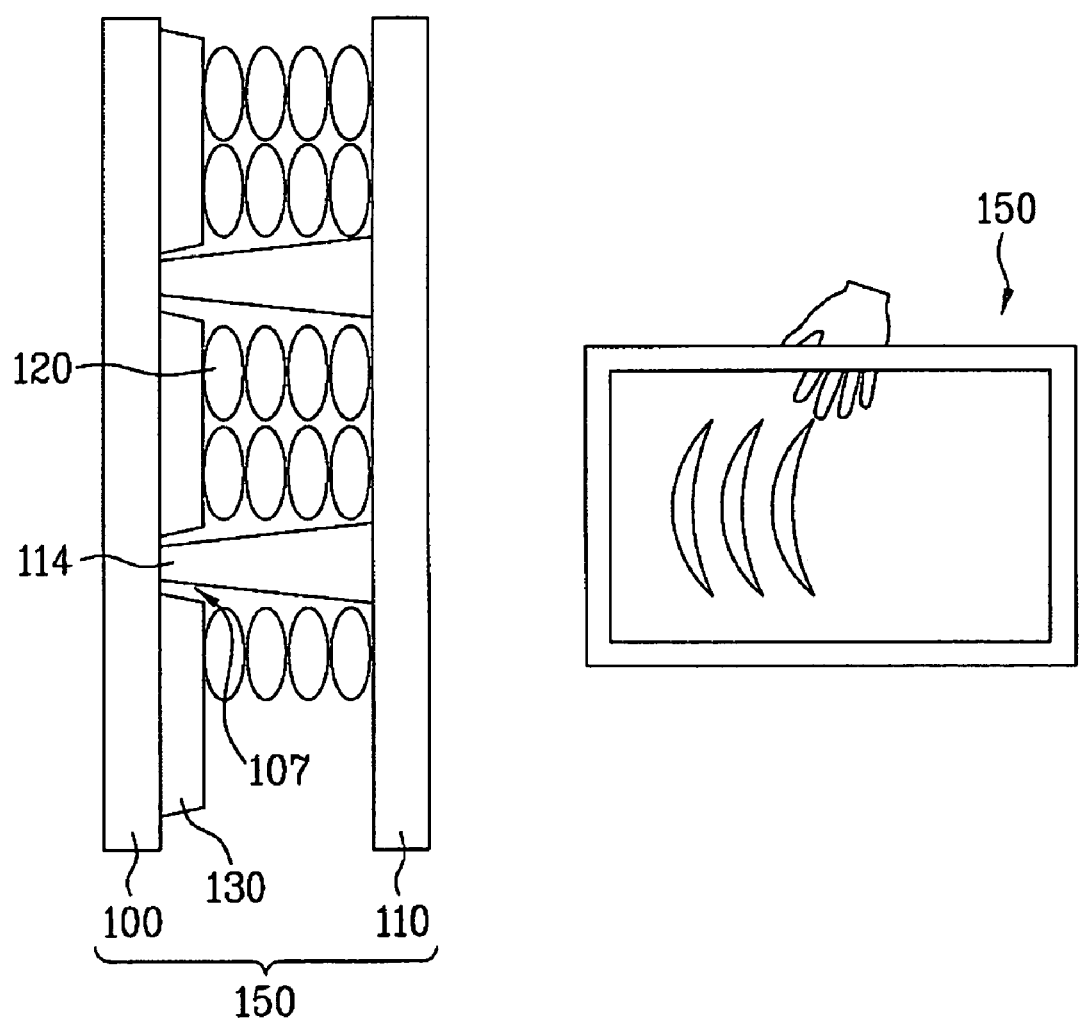
FIGS. 11A and 11B illustrate an LCD device before and after touching.
Figure 11B:
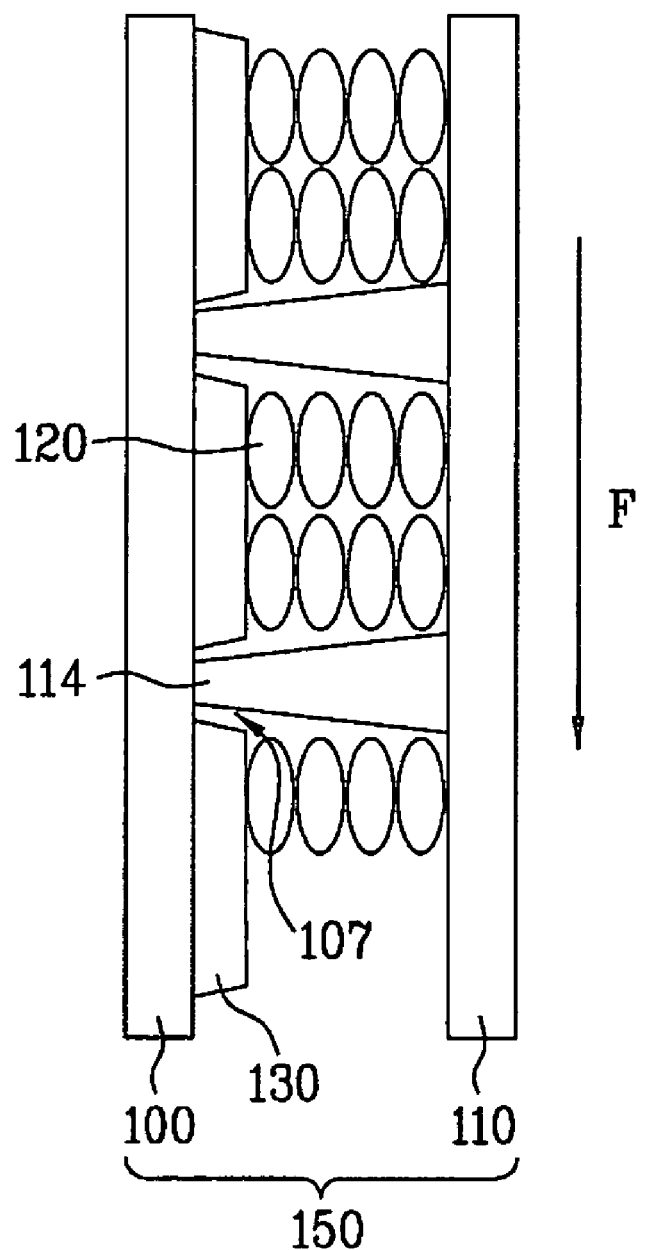

FIGS. 11A and 11B illustrate the state of an above-described LCD device before and after touching. In FIG. 11A, the LCD device 150 of the LCD device includes first and second substrates 100 and 110 facing each other, liquid crystal molecules 120 disposed between the two substrates, a high step difference portion 130 having a storage hole 107, and a column spacer 114 formed on the second substrate 110 entering a storage hole 107 and contacting the first substrate 100. The high step difference portion 130 corresponds to a portion including additional layers, except the storage hole formed on the gate line. The additional layers may include a gate insulating layer, an inorganic passivation layer, an organic passivation layer etc.

As shown in FIG. 11A, even if the surface of the LCD device 150 is touched by a finger according to a predetermined force F, the column spacer 114 only moves inside the storage hole 107 between the respective high step difference portions. Therefore, the second substrate 110 is prevented from being pushed against the first substrate 100. Accordingly, it is possible to avoid light leakage resulting from the black matrix layer straying due to a push of the substrate caused by touch. Moreover, since movement of the column spacer 114 is restricted to the area defined by the storage hole 107, it is possible to avoid an uneven cell gap caused by a push of the substrate resulting from external conditions, such as touch.

The above-described LCD device has been applied to TN-mode LCD devices where the pixel electrodes are formed on the first substrate in each pixel region and a common electrode is formed on the entire surface of the second substrate. However, the above-described LCD device may be adapted to an IPS-mode LCD device, provided that the column spacers are formed to correspond to the storage hole.

The above-described LCD devices include several advantages over the related art. First, the column spacer is formed on the second substrate to correspond to a storage hole on the first substrate, so that movement of the column spacer is restricted to the area inside the storage hole, even in the presence of external forces, such as touch. This can reduce shifting or pushing of the second substrate relative to the first substrate in the range of the bonding margin or less. To the extent that shifting or pushing of the second substrate against the first substrate is reduced in the range of the bonding margin or less, it is possible to prevent light leakage from occurring. Moreover, inasmuch as the storage hole is formed at a depth within the range of the cell gap, and the column spacer is formed to correspond to the storage hole to restrict movement of the column spacer to the storage hole, it is possible to avoid an uneven cell gap caused by column spacers in other portions due to a push of the substrate. Finally, by minimizing the pushing or shifting of the substrate caused by touch, it is possible to minimize to wrinkles on the surface of the substrate and to avoid uneven alignment of the liquid crystal molecules.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An LCD device comprising: first and second substrates facing each other; gate and data lines on the first substrate defining a pixel region; a thin film transistor comprising: a gate electrode protruding from the gate line; a source electrode protruding from the data line; and a drain electrode spaced from the source electrode at a predetermined interval; a metal pattern disposed over a predetermined portion of the gate line; at least one passivation layer disposed over the data line and the metal pattern, the passivation layer having a contact hole exposing the drain electrode and a storage hole exposing the metal pattern, wherein the at least one passivation layer comprises an organic insulating layer; a pixel electrode disposed on the pixel region over the contact hole and the storage hole; a column spacer configured to contact the pixel electrode in the storage hole for reducing instantaneous light leakage when a touch is laterally applied to one of the first substrate and the second substrate; and a liquid crystal layer between the first and second substrates, wherein the at least one passivation layer has a thickness of about 2 μm to 3 μm and a cell gap of the liquid crystal layer is about 3 μm to 5 μm, wherein a width of the storage hole is a critical dimension corresponding to a value obtained by adding a critical dimension of the column spacer to a bonding margin, the bonding margin being laterally about 4 μm to 5 μm and wherein a depth of the storage hole defined by removing the at least one passivation layer on the metal pattern is about ½~1 time of the cell gap of the liquid crystal layer.

2. The LCD device as claimed in claim 1, wherein the pixel electrode partially overlaps data lines at both sides adjacent to the pixel region.

3. The LCD device as claimed in claim 1, wherein the at least one passivation layer further comprises an inorganic insulating layer.

4. The LCD device as claimed in claim 1, further comprising a gate insulating layer between the gate line and the data line.

5. The LCD device as claimed in claim 1, wherein the metal pattern is in the same layer as the data line.

6. The LCD device as claimed in claim 1, further comprising:
a black matrix layer formed on the second substrate over non-pixel regions, including the thin film transistor;
a color filter layer formed over the second substrate and the black matrix layer; and
a common electrode formed over the second substrate, including the black matrix layer and the color filter layer.

7. The LCD device as claimed in claim 1, further comprising a color filter layer between the data line and the passivation layer.

8. The LCD device as claimed in claim 7, further comprising a black matrix layer formed on the first substrate to correspond to non-pixel regions, including the thin film transistor.

9. The LCD device as claimed in claim 1, wherein the column spacer contacts the pixel electrode through the storage hole.

* * * * *